(12) United States Patent
Vadi et al.

(10) Patent No.: US 7,196,940 B1
(45) Date of Patent: Mar. 27, 2007

(54) METHOD AND APPARATUS FOR A MULTIPLEXED ADDRESS LINE DRIVER

(75) Inventors: Vasisht Mantra Vadi, San Jose, CA (US); David P. Schultz, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 197 days.

(21) Appl. No.: 10/971,394

(22) Filed: Oct. 22, 2004

(51) Int. Cl.
*G11C 7/10* (2006.01)

(52) U.S. Cl. .................... 365/189.02; 365/185.24; 365/189.09

(58) Field of Classification Search .......... 365/189.09, 365/189.07, 189.11, 189.12, 185.18, 185.23, 365/185.24, 230.06, 230.08, 189.02
See application file for complete search history.

(56) References Cited

U.S. PATENT DOCUMENTS

| | | | | |
|---|---|---|---|---|
| 5,317,212 A | * | 5/1994 | Wahlstrom | .................. 326/44 |
| 6,335,896 B1 | * | 1/2002 | Wahlstrom | ............. 365/230.03 |
| 6,567,309 B2 | * | 5/2003 | Tanzawa | ................ 365/185.18 |
| 6,859,411 B2 | * | 2/2005 | Pfeiffer et al. | ......... 365/230.06 |
| 7,009,881 B2 | * | 3/2006 | Noguchi | ................ 365/185.17 |

OTHER PUBLICATIONS

U.S. Appl. No. 10/796,750, filed Mar. 8, 2004, Vadi et al.
U.S. Appl. No. 10/970,964, filed Oct. 22, 2004, Vadi et al.

* cited by examiner

*Primary Examiner*—Gene N. Auduong
(74) *Attorney, Agent, or Firm*—LeRoy D. Maunu

(57) ABSTRACT

A method and apparatus for multiplexing various voltage magnitudes onto the address line of a memory cell. An address line voltage generator applies complex analog voltage magnitudes to a memory cell address line during Power On Reset (POR) to insure proper memory cell initialization during power up. Once initialized, read and write address select signals are level shifted to be equal to or greater than the read and write voltage magnitudes applied to the memory cell address line to ensure proper operation.

17 Claims, 5 Drawing Sheets

METHOD AND APPARATUS FOR A MULTIPLEXED ADDRESS LINE DRIVER

FIELD OF THE INVENTION

The present invention generally relates to memory cell addressing schemes, and more particularly to a voltage multiplexing architecture used in conjunction with the memory cell addressing and power up schemes of a Programmable Logic Device (PLD).

BACKGROUND OF THE INVENTION

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Part of the FPGA design methodology is to allocate one or more power supplies within the FPGA depending upon the requirements of the particular functional blocks that are incorporated within the FPGA. Some FPGA blocks, such as the BRAMs, are designed with transistors having relatively thin gate oxide layers for operation at a relatively low voltage level to minimize power consumption. In the I/O portions of the FPGA, on the other hand, a higher operational voltage is required because communication with devices external to the FPGA necessitates an extended dynamic range. Still other portions of the FPGA are designed for operation using multiple power supply magnitudes, thus requiring transistors exhibiting varying oxide thicknesses, depending upon voltage level.

A programmable interconnect tile is then used to interconnect the various blocks of the FPGA. N-type Metal Oxide Semiconductor (NMOS) transistors, for example, are typically used as passgates, whereby higher level signals incident at the gate terminal of the passgates cause relatively lower level signals to propagate from the drain to source, or from the source to drain, terminals.

In the prior art, the disparity between the $V_{GG}$ level signals and the $V_{DD}$ level signals is minimal, being separated, for example, by approximately 50 millivolts (mV). Allowing for a greater differential to exist between $V_{GG}$ and $V_{DD}$ would provide several advantages not currently realized by the prior art. Among these advantages includes, providing for an extended differential between the $V_{GG}$ and $V_{DD}$ voltage levels to allow for an improved propagation time through the interconnect tile.

Such a voltage differential, however, is generally not supported by the prior art and hence cannot support an improved propagation time. Large voltage differentials were supported in the early version PLDs, however, such a voltage differential cannot be supported by the modern deep sub-micron and sub-100 nanometer (nm) memory cell designs.

SUMMARY OF THE INVENTION

To overcome limitations in the prior art, and to overcome other limitations that will become apparent upon reading and understanding the present specification, the present invention discloses an apparatus and method for multiplexing analog voltages onto an address line of a memory cell. The multiplexing occurs in a manner that is consistent with an operational state of the memory cell.

In accordance with one embodiment of the invention, a method of controlling a signal level of a memory cell address line comprises detecting an operational state of a memory cell, selecting one of a plurality of multiplexed signal levels onto the memory cell address line in response to the operational state, and level shifting a first logic level of a memory cell address select line to be at least equal to the selected signal level.

In accordance with another embodiment of the invention, a memory cell address line generator comprises an analog driver that is adapted to generate a first signal having first and second amplitudes. The memory cell address line generator further comprises an address line generator that is coupled to the analog driver and is adapted to provide the first signal to a memory cell address line during first and second modes of operation and is further adapted to apply a second signal having a plurality of amplitudes to the memory cell address line during a third mode of operation. The memory cell address line generator further comprises a level shifter that is coupled to the analog driver and is adapted to increase a level of a received memory cell address select signal to be at least equal to the first and second amplitudes of the first signal.

In accordance with another embodiment of the invention, a system of addressing a memory cell within a Field Programmable Gate Array (FPGA) comprises means for applying a plurality of voltage signal levels to an address line of a memory cell during a power up sequence, means for applying a read voltage signal level to the address line during a read sequence, means for applying a write voltage signal level to the address line during a write sequence, and means for shifting an amplitude of an address select signal associated with the memory cell to be at least equal to the read and write voltage signal levels during the respective read and write sequences.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

The various embodiments of the present invention may be applied to the field of PLDs, which utilize a plurality of operational voltage levels during operation. The present invention contemplates a scheme to selectively drive the address line of a memory cell array to any one of these operational voltage magnitudes as needed. The operational voltage magnitudes may be directly connected to power supplies, or may be optionally derived from the power supplies via, e.g., voltage regulators.

Any combination of memory cells may be supported, to include so-called heterogeneous columns containing a mix of memory cells operating from different operational voltage levels. In one embodiment according to the present invention, for example, a complex multiplexer receives operational voltages from an analog voltage generator and in response to operational logic, applies the correct operational voltage to the memory cell address lines. As such, the correct voltage magnitude is applied to the memory cell address lines depending upon the corresponding operational state, e.g., memory cell read, memory cell write, or memory cell power-up.

It should be noted that while only three memory cell operational states are discussed herein, any number of operational states, N, may be supported by an embodiment of the present invention to generate, $V_N$, address line voltage magnitudes. As such, $V_N$ voltage magnitudes may be multiplexed onto the address lines of the memory cells as required by the particular application.

Figure 1:
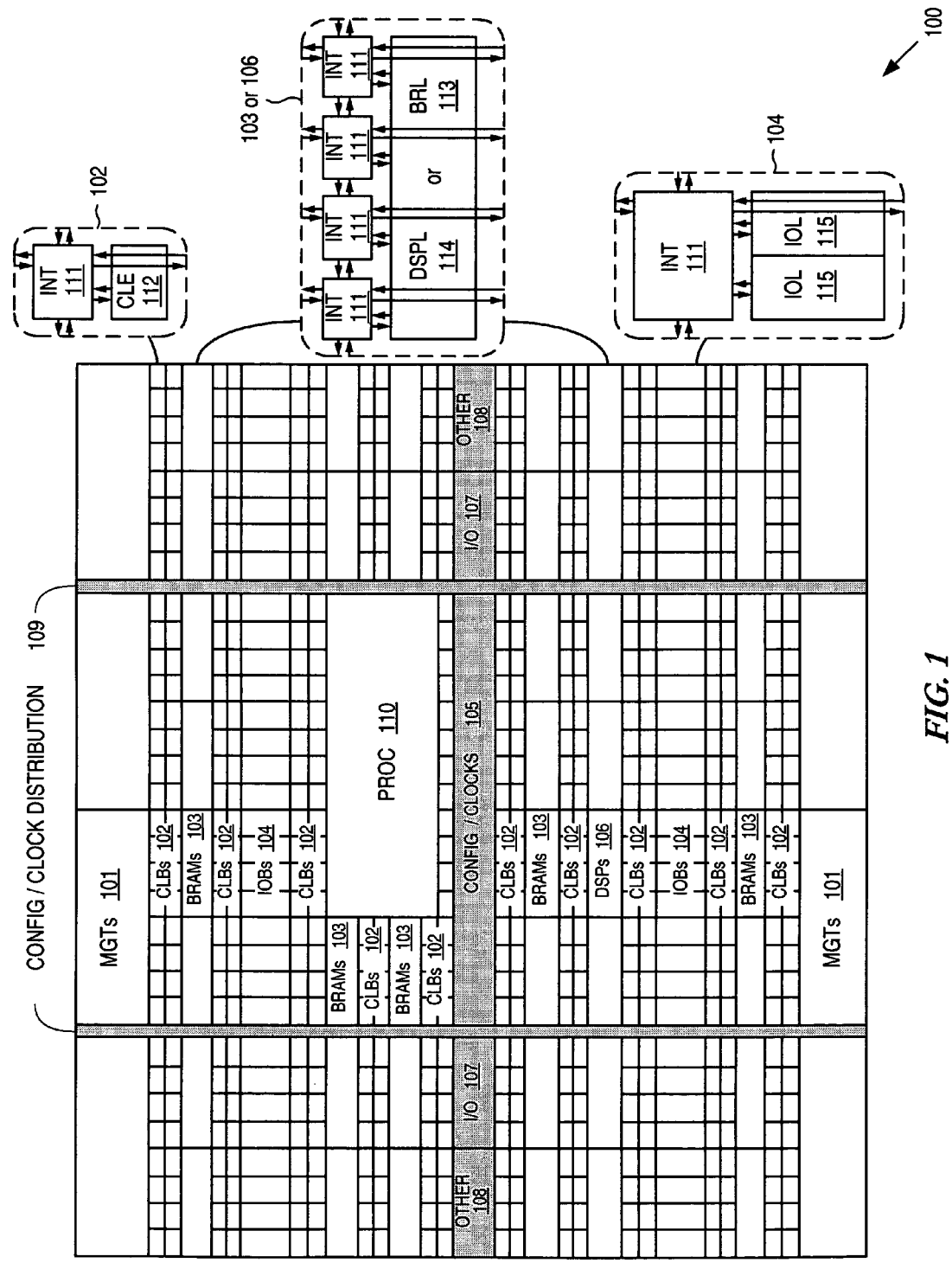
FIG. 1 illustrates an example Field Programmable Gate Array (FPGA) architecture.

As noted above, advanced FPGAs can include several different types of programmable logic blocks in the array. For example, FIG. 1 illustrates an FPGA architecture 100 that includes a large number of different programmable tiles including Multi-Gigabit Transceivers (MGTs) 101, CLBs 102, BRAMs 103, IOBs 104, configuration and clocking logic CONFIG/CLOCKS 105, DSPs 106, specialized I/O 107, including configuration ports and clock ports, and other programmable logic 108, such as digital clock managers, analog-to-digital converters, system monitoring logic, and so forth. Some FPGAs also include dedicated processor blocks PROC 110.

In some FPGAs, each programmable tile includes programmable interconnect element INT 111 having standardized connections to and from a corresponding interconnect element in each adjacent tile. Therefore, the programmable interconnect elements taken together implement the programmable interconnect structure for the illustrated FPGA. INT 111 also includes the connections to and from the programmable logic element within the same tile, as shown by the examples of blocks 102, 103 or 106, and 104.

For example, a CLB 102 may include a Configurable Logic Element CLE 112 that may be programmed to implement user logic plus a single programmable interconnect element INT 111. A BRAM 103 may include a BRAM logic element BRL 213 in addition to one or more programmable interconnect elements. Typically, the number of interconnect elements included in a tile depends on the height of the tile (as measured from right to left of FIG. 1). In the pictured embodiment, for example, a BRAM tile has the same height as four CLBs, but other multiples (e.g., five) may also be used. A DSP tile 106 may include a DSP logic element DSPL 114 in addition to an appropriate number of programmable interconnect elements. An IOB 104 may include, for example, two instances of an input/output logic element IOL 115 in addition to one instance of the programmable interconnect element INT 111. As will be clear to those of skill in the art, the actual I/O pads connected, for example, to the I/O logic element 115 are manufactured using metal layers above the various illustrated logic blocks, and typically are not confined to the area of the input/output logic element 115.

The programmable functional elements, e.g., CLBs and IOBs, and the programmable interconnect elements are programmed or configured using, in one embodiment, static random access memory cells. These memory cells are configured as described in co-pending, commonly assigned U.S. patent application Ser. No. 10/796,750 filed Mar. 8, 2004 entitled "Segmented Dataline Scheme in a Memory with Enhanced Full Fault Coverage Memory Cell Testability," by Vasisht M. Vadi, et al., which is herein incorporated by reference and in concurrently filed U.S patent application, entitled "A METHOD AND SYSTEM FOR CONFIGURING AN INTEGRATED CIRCUIT", by Vasisht M. Vadi, et al., which is herein incorporated by reference.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an example FPGA architecture. The number of logic blocks in a column, the relative width of the columns, the number and order of columns, the type of logic blocks included in the columns, the relative size of the logic blocks, and the interconnect/logic implementations 102, 103 or 106, and 104 are examples. For example, in an actual FPGA more than one adjacent column of CLBs is typically included wherever the CLBs appear, to facilitate the efficient implementation of user logic.

As discussed above, memory cells existent within, for example, INT 111 operate at a higher operating voltage as compared to memory cells existent within an FPGA core, for example, CLE 112. In particular, memory cells within INT 111 operate at a power supply level of $V_{GG}$, whereas memory cells within the FPGA core operate at the lower voltage of $V_{DD}$. In addition, the voltage level present at each of the address lines of the respective $V_{GG}$ or $V_{DD}$ memory cells must be set in accordance with the particular operation being conducted, e.g., write, read, or power-up.

During power-up of FPGA 100, for example, several phases of voltage control are performed in accordance with an embodiment of the present invention in order to avoid power supply contention and high current paths that may develop during such power supply contention. In order to initiate the first phase of power-up, a Power-On Reset (POR) signal is asserted, which is effective to disable a major portion of FPGA 100 to allow a smooth ramp up of the operational voltages, denoted hereinafter as $V_{CCAUX}$ and $V_{DD}$ voltages, as well as other auxiliary voltages associated with FPGA 100, denoted hereinafter as $V_{CCO}$. In addition during phase 1, all generated analog voltages, e.g., $V_{GG}$, and memory cell address lines are held at a logic low level. Once each of the power supplies has achieved a minimum voltage magnitude, e.g., a magnitude equivalent to at least 50% of their nominal value, then signal POR is de-asserted to begin phase 2.

During phase 2, a disable $V_{GG}$ pull-down signal remains asserted to continue to require that the $V_{GG}$ net, or grid, is held to a 0 volt potential for a pre-determined amount of time after the POR signal is deasserted. Once the disable $V_{GG}$ pull-down signal is deasserted, the $V_{GG}$ grid is released from the 0 volt requirement and is allowed to slowly ramp up. In addition, each of the address line drivers for the $V_{GG}$ memory cells are expected to weakly drive the address lines of all the $V_{GG}$ memory cells during phase 2. In this way, the $V_{GG}$ power supply and the address lines of the $V_{GG}$ memory cells ramp up at substantially the same rate, thus allowing a known configuration state to be achieved for each $V_{GG}$ memory cell, e.g., output Q=0; output $\overline{Q}$=1.

Once the $V_{GG}$ address lines have achieved a voltage magnitude of at least a transistor threshold voltage, $V_t$, the initialization of the $V_{GG}$ memory cells completes to mark the end of phase 2. Phase 3 allows the $V_{GG}$ power supply to attain its final value after the $V_{GG}$ memory cells have been correctly initialized, while the $V_{GG}$ address line voltage level is held to a logic low value. Completion of phase 3 marks the end of power up operation.

In one embodiment according to the present invention, therefore, a $V_{GG}$ address line generator is contemplated, which supports the complex power-up sequence as discussed above in relations to phases 1–3.

Figure 2:
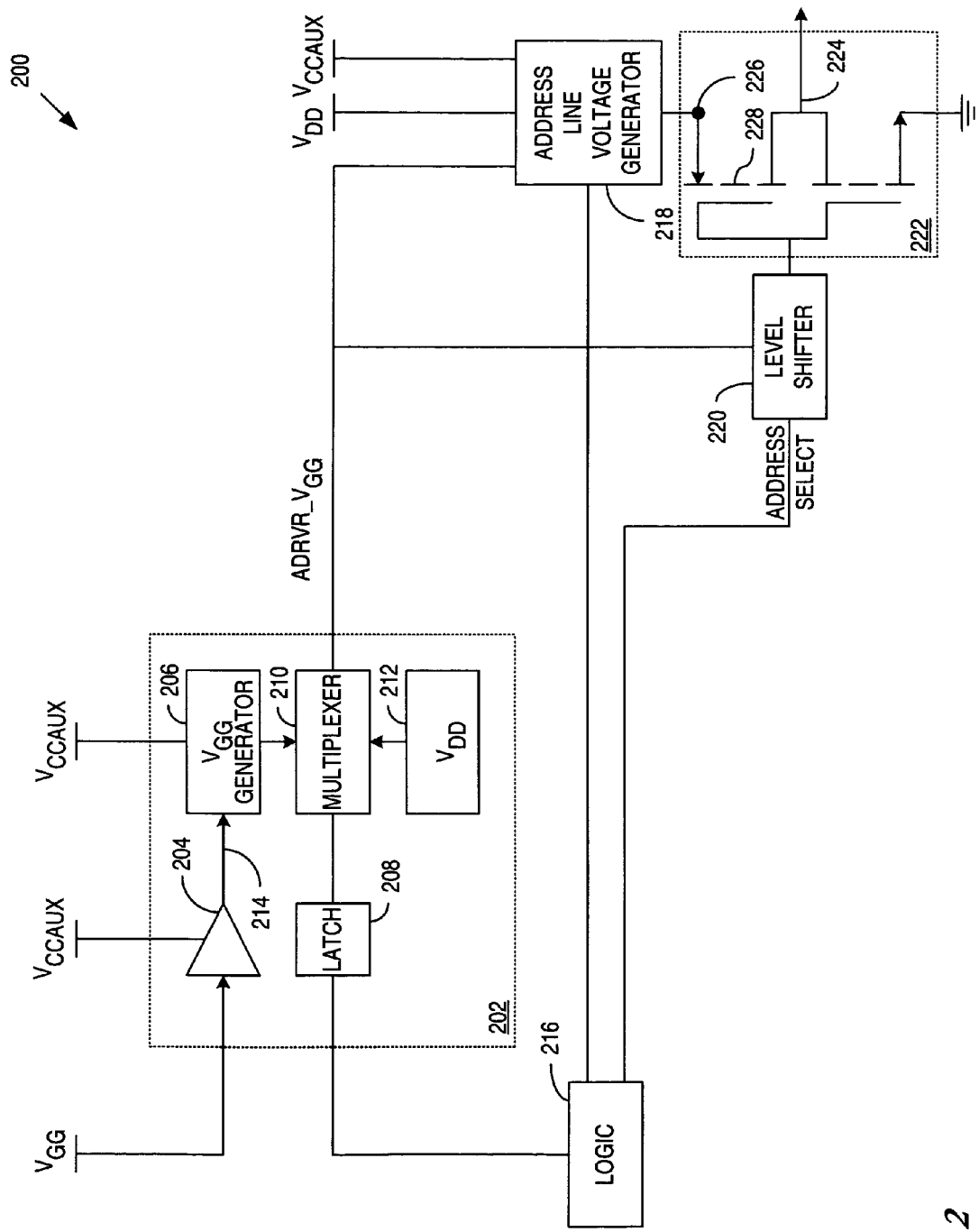
FIG. 2 illustrates an example memory cell address line generator in accordance with the present invention.

In addition to the complex power-up sequence, the $V_{GG}$ address line generator also supports the write and read sequences pertaining to the $V_{GG}$ memory cell as required. Turning to FIG. 2, an example $V_{GG}$ address line generator 200 in accordance with an embodiment of the present invention is now discussed. Generally speaking, $V_{GG}$ address line generator 200 generates any address line voltage that may be required by the particular memory cell address line 224 being addressed.

That is to say, that address line voltage 224 may take on substantially any voltage value during the power-up, write, or read sequences as required by the memory cell being addressed, to insure proper operation through all sequences. While $V_{GG}$ address line generation for $V_{GG}$ memory cells is discussed in relation to FIG. 2, it should be noted that the operation of FIG. 2 is applicable to any other memory cell address line generation that may be required within the PLD.

Logic block 216 in conjunction with address line voltage generator 218 controls the voltage magnitude present at address line 224 through the entire power-up sequence, as well as through the subsequent read and write sequences required during operation of the PLD. It should be noted also, that FIG. 2 represents a single address line voltage generator that is used by one of the many address lines that may be required in the PLD.

Address line voltage generator 218 accepts power supply inputs $V_{DD}$ and $V_{CCAUX}$, as well as the regenerated analog voltage, ADRVR_$V_{GG}$, from analog driver 202 and logic signals from logic block 216 to determine the magnitude of the address line voltage 224. The regenerated analog voltage, ADRVR_$V_{GG}$, may represent a magnitude that is substantially equal to 80% of the magnitude of generated voltage, VGG, due to transistor mismatch.

During the first phase of power-up as discussed above, address line voltage generator 218 determines if power supply $V_{DD}$ obtains its operational voltage magnitude sooner than power supply $V_{CCAUX}$. If so, address line 224 is forced to a logic zero value, e.g., ground potential, until such time as the $V_{CCAUX}$ power supply has reached its operational voltage level.

During the initial portion of the second phase of power-up, address line 224 continues to be held at a logic zero value through operation of address line voltage generator 218, in response to the disable $V_{GG}$ pull-down signal that is received from logic block 216 as discussed above. After a pre-determined amount of time has passed, the disable $V_{GG}$ pull-down signal is deasserted and in response, address line voltage generator 218 weakly drives address line 224 to slowly bring it to a voltage level of at least a transistor threshold voltage, $V_t$. The slow ramp up of voltage on address line 224 is effective to properly initialize the memory cell (not shown) that is attached to address line 224.

Address line voltage generator 218 is also effective to provide the proper voltage level to address line 224 depending upon whether the column of a particular memory cell, as illustrated in FIG. 1, of the PLD has been activated for use. If, for example, the memory cell's column is selected for writing, then its corresponding address line 224 is driven to a voltage level substantially equal to 80% of the voltage generated by $V_{GG}$ generator 206. If, on the other hand, the memory cell's column is deselected for writing, then its corresponding address line 224 is driven to a voltage level substantially equal to $V_{DD}$.

Thus, in a write state, address line voltage generator 218 selects the maximum voltage that is obtainable for application to address line 224, e.g., from $V_{GG}$ generator 206. If, on the other hand, the column is deselected for a write state or is otherwise not in use, then address line voltage generator 218 selects $V_{DD}$ for application to address line 224. Likewise, analog driver 202 disables buffer 204 and $V_{GG}$ generator 206 and selects voltage supply $V_{DD}$ via multiplexer 210 to be routed to the ADRVR_$V_{GG}$ terminal.

Figure 3:
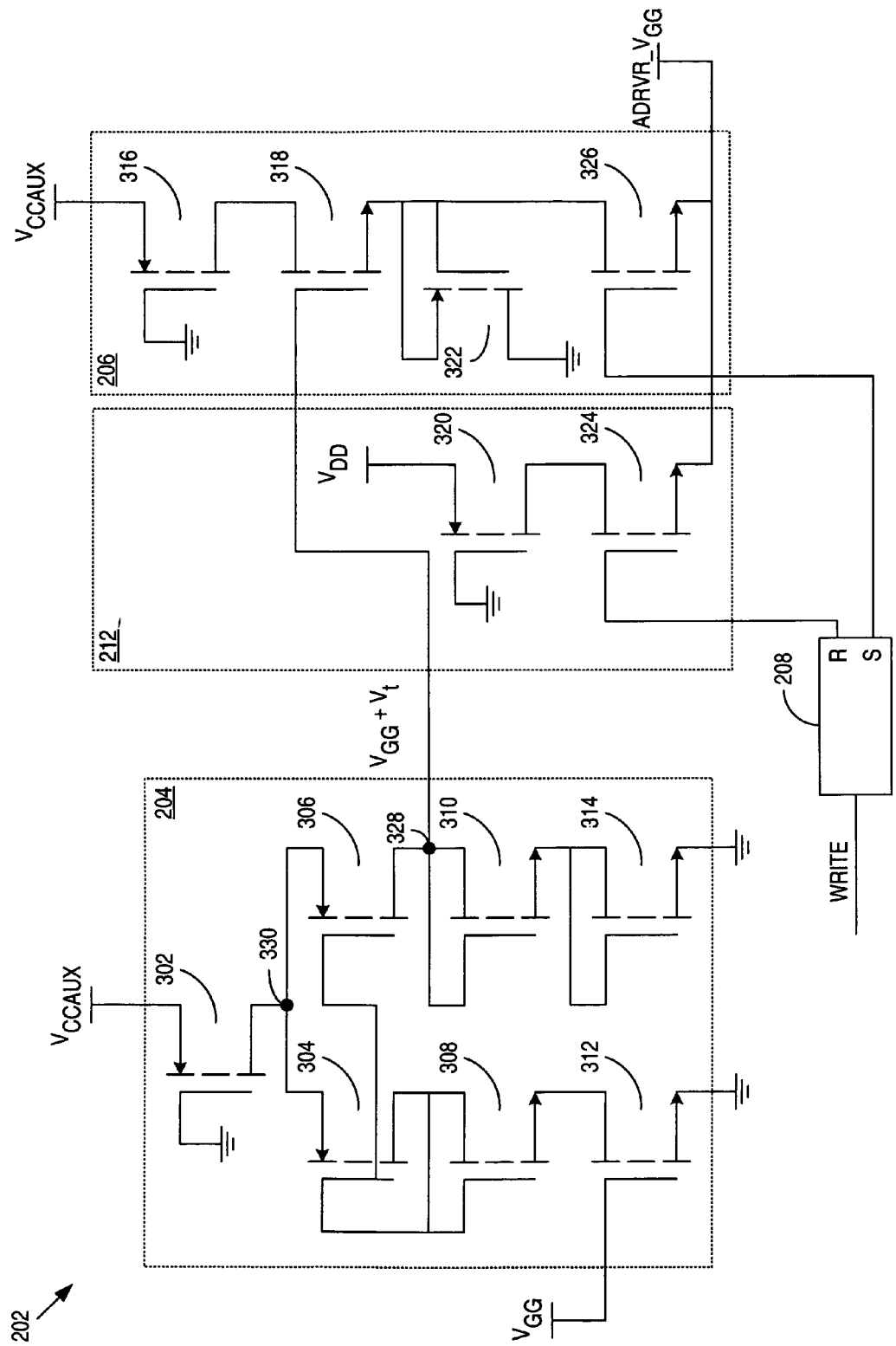
FIG. 3 illustrates an example schematic of the analog driver of FIG. 2.

$V_{GG}$ of a PLD is generally a regulated power supply and as such is a very stable reference voltage. The $V_{GG}$ power grid, however, is generally unable to source a large amount of current due to the current limitations of its associated voltage regulator. Thus, buffer 204 and $V_{GG}$ generator 206 combine to regenerate $V_{GG}$ from $V_{CCAUX}$ at the ADRVR_$V_{GG}$ terminal, whereby the regenerated $V_{GG}$ exhibits an increased current sourcing capability from power supply $V_{CCAUX}$, while at the same time exhibiting a voltage magnitude that may only be substantially equal to 80% of $V_{GG}$. Turning to FIG. 3, an example schematic of analog driver 202 is illustrated.

In operation, analog driver 202 generates an analog potential substantially equal to the magnitude of the regulated $V_{GG}$ power supply plus a transistor threshold voltage, $V_t$, as can be verified at node 328. In particular, buffer 204 receives a control voltage, e.g., the regulated $V_{GG}$ voltage, at the control terminal of transistor 312. Once the gate-to-source potential, $V_{GS}$, of transistor 312 has exceeded its threshold voltage, $V_t$, transistor 312 is rendered conductive to sink the current provided by transistor 302 from power supply $V_{CCAUX}$.

Transistor 306 shares its gate connection with transistor 304, such that the $V_{GS}$ of transistor 306 is substantially equivalent to the $V_{GS}$ of transistor 304. Thus, the current conducted by transistor 304 is mirrored by the current conducted by transistor 306 in ratio proportion to the respective geometries of transistor 306 to 304. Given that transistors 304 and 306 each exhibit substantially identical geometry, for example, the current conducted by transistor 306 is substantially equal to the current conducted by transistor 304. Diode connected transistors 308, 310 and 314 also provide a $V_t$ voltage drop across their respective drain-source terminals.

Buffer 204 thus translates the voltage at the control terminal of transistor 312, e.g., the regulated $V_{GG}$ voltage, to a voltage that is higher in magnitude by one transistor threshold voltage, $V_t$, at node 328. The increased voltage magnitude at node 328 is then applied to the control terminal of transistor 318 of $V_{GG}$ generator 206, which renders transistor 318 conductive to sink the current provided by transistor 316 from power supply $V_{CCAUX}$. Once conductive, the $V_{GS}$ of transistor 318 is substantially equal to a transistor threshold voltage, $V_t$, and as such, is effective to provide a voltage magnitude that is approximately equal to 80% (more or less) of the regulated voltage $V_{GG}$ at terminal ADRVR_$V_{GG}$.

In order to insure the $V_t$ voltage drop across transistor 318, a "leaker" current source is implemented using transistor 322, and is configured as a very small, e.g., microamp (μL), current source. Through operation of transistor 322, therefore, a very small amount of current on the order of microamps is guaranteed to flow through transistor 318, thus insuring the $V_t$ voltage drop across transistor 318.

The source terminals of transistors 324 and 326 share a common connection at terminal ADRVR_$V_{GG}$ and as such, represent a multiplexing operation. That is to say, that either the voltage at the source terminal of transistor 326, or the voltage at the source terminal of transistor 324 is applied to terminal ADRVR_$V_{GG}$ depending upon the logic state of signal WRITE. Given that the logic state of signal WRITE is a logic high value, for example, then the set output, S, of SR latch 208 is asserted, which then renders $V_{GG}$ generator 206 active to effectively apply the source voltage of transistor 326 to terminal ADRVR_$V_{GG}$. Conversely, if the logic state of signal WRITE is a logic low value, then the reset output, R, of SR latch 208 is asserted, which then renders $V_{DD}$ block 212 active to effectively apply the source voltage of transistor 324 to terminal ADRVR_$V_{GG}$. In this instance, transistor 320 is conductive to conduct current from power supply $V_{DD}$ to terminal ADRVR_$V_{GG}$.

Thus, in a write phase of operation (i.e., signal WRITE is asserted), an analog voltage approximately equal to $V_{GG}$ is regenerated at terminal ADRVR_$V_{GG}$, which exhibits an augmented current sourcing capability through the use of the $V_{CCAUX}$ power supply. Conversely, during a non-write phase of operation (i.e., signal WRITE is deasserted), power supply approximately equal to $V_{DD}$ is applied to terminal ADRVR_$V_{GG}$, as discussed above. It should be noted, that the regenerated $V_{GG}$ at node ADRVR_$V_{GG}$ may not be precisely regenerated at the same magnitude as supplied by the regulated $V_{GG}$, due to the $V_t$ mismatch that may exist between the transistors of buffer 204 and $V_{GG}$ generator 206. However, through the use of proper design procedures and Monte Carlo simulation sweeps, the effects of any $V_t$ mismatch may be substantially eliminated.

Figure 4:
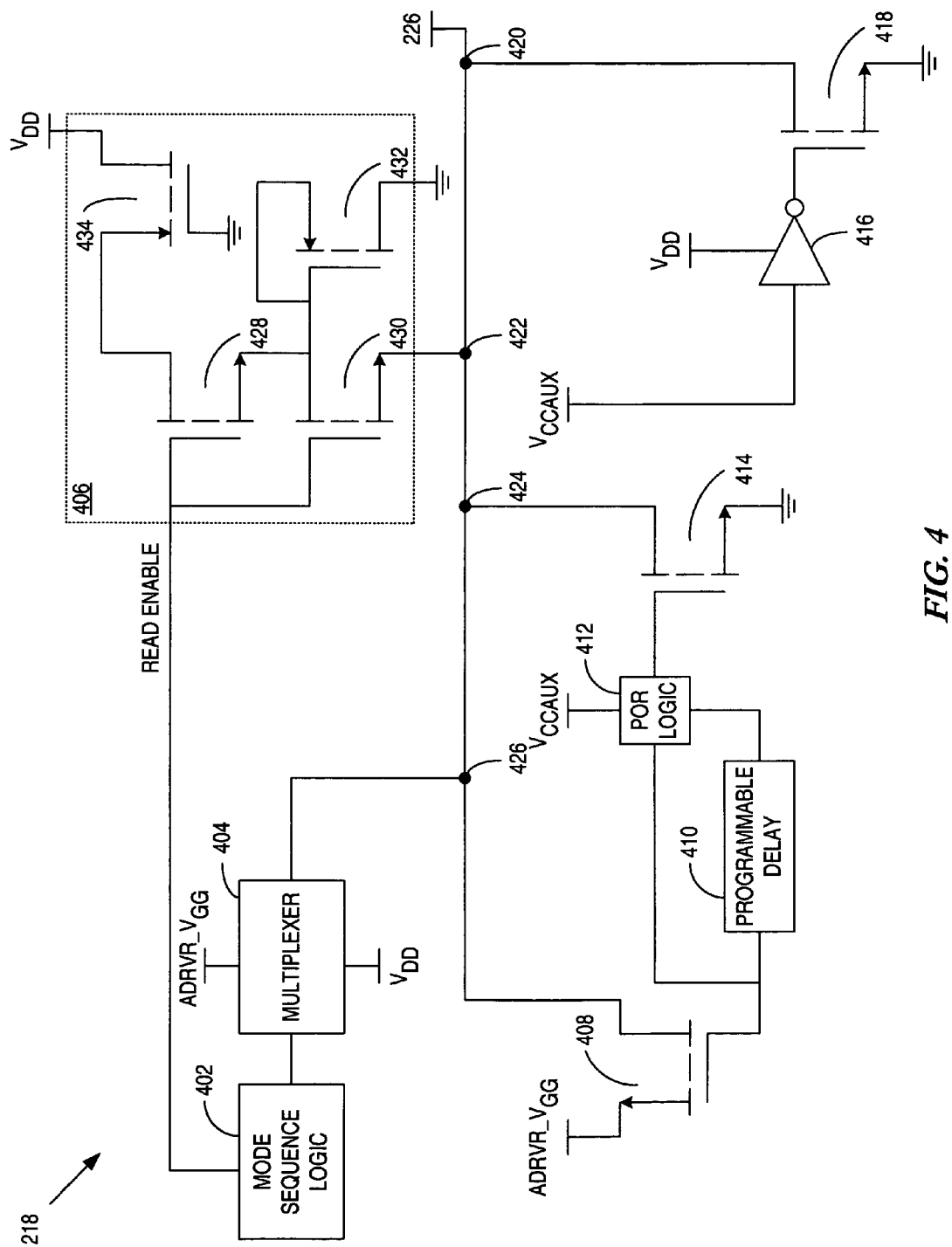
FIG. 4 illustrates an example schematic of the address line voltage generator of FIG. 2.

Turning to FIG. 4, an example schematic diagram of address line voltage generator 218 of FIG. 2 is now discussed. As exemplified in FIG. 2, address line voltage generator 218 provides the top rail power supply, $V_{226}$, for inverter 222. Thus, the logic high potential that is applied to address line 224 by inverter 222 is governed through the operation of address line voltage generator 218 in conjunction with logic 216 and analog driver 202.

The operation of address line voltage generator 218 may be explained in relation to each phase of operation that is associated with address line 224. In particular, during the first phase of POR, inverter 416 and transistor 418 combine to detect a condition whereby power supply $V_{DD}$ has reached its nominal operational voltage magnitude, but power supply $V_{CCAUX}$ has not. In such an instance, the output of inverter 416 is at a logic high value that renders transistor 418 into its conductive state, which in turn forces node 420, i.e., the voltage at terminal 226, to be substantially equal to ground potential.

During a second phase of POR, POR logic 412 renders transistor 414 into a conductive state in order to hold node 424, i.e., the voltage at terminal 226, to a 0 volt potential for a pre-determined amount of time as determined by programmable delay 410. After the pre-determined amount of time has expired, POR logic 412 renders transistor 414 into its non-conductive state, while transistor 408 is rendered into its conductive state. In this way, address line voltage generator 218 applies the regenerated $V_{GG}$ voltage to terminal ADRVR_$V_{GG}$, so that ADRVR_$V_{GG}$ and address line 224 are allowed to ramp up at substantially the same rate, thus allowing a known configuration state to be achieved for the corresponding memory cell (not shown), e.g., output Q=0 and output $\overline{Q}$=1.

Once initialized, the memory cell (not shown) is configured to be in a "write" state via mode sequence logic 402 and multiplexer 404, by applying the re-generated $V_{GG}$ voltage to terminal 226. Conversely, when the column in which the memory cell resides is disabled, or is otherwise in a non-write state, mode sequence logic 402 and multiplexer 404 apply the lower voltage, $V_{DD}$, to node 426. In addition, buffer 204 is disabled to reduce the quiescent current drain of analog driver 202 when the column is disabled.

During a read operation, buffer 204 is also disabled to reduce its quiescent current drain. In addition, read block 406 is operative to gently apply $V_{DD}$ to terminal 226 once signal READ ENABLE is asserted by mode sequence logic 402. In particular, transistor 434 is configured as a current source to supply current to transistor 428 once transistor 428 is rendered conductive by signal READ ENABLE.

The voltage drop across the drain and source terminals of transistor 428 is guaranteed by leaker current source 432. Thus, the voltage applied to node 422, e.g., the voltage at terminal 226, via transistor 430 during the read mode is substantially equal to 80% of $V_{DD}$. In addition, leaker current source 432 is effective to control the rate at which terminal 226 achieves the "read" voltage as well as to control the maximum voltage obtained at terminal 226. The reduced ramp rate and maximum voltage obtained helps to prevent a disturbance to the memory cell during the read process and minimizes any bump in the memory cell during the read operation.

Turning back to FIG. 2, it can be seen that the top rail power supply of level shifter 220 and inverter 222 may be at two different voltage magnitudes. As discussed above, the voltage at terminal ADRVR_$V_{GG}$ may be equal to either the regenerated $V_{GG}$ potential or $V_{DD}$, depending upon the particular phase of operation. The voltage at terminal 226, on the other hand, may essentially take on any number of voltage magnitudes, depending upon the memory cell being addressed and its operational state.

As such, without the operation of level shifter 220, a possibility exists such that a logic high level presented at the input to inverter 222 by logic 216 may not achieve a voltage magnitude that is equal to or greater than the top rail power supply voltage magnitude at terminal 226. Such a condition causes sub-threshold current to be conducted by the P-type transistor 228 of inverter 222 when a logic low level is desired at address line 224. In such an instance, P-type transistor 228 is not completely turned off.

Thus, in accordance with an embodiment of the present invention, level shifter 220 shifts the voltage magnitude of the logic high signals transmitted by $V_{DD}$ logic 216 to be substantially equal to either $V_{DD}$ or the regenerated $V_{GG}$ potential, whichever is present at terminal ADRVR_$V_{GG}$. In this way, the logic high potential presented to the input of inverter 222 by level shifter 220 is guaranteed to be equal to or greater than the top rail power supply level presented at terminal 226. As such, irrespective of the particular voltage that is generated by address line voltage generator 218 at node 226, P-type transistor 228 of inverter 222 is rendered non-conductive when a logic low level is desired on address line 224.

It can be seen, therefore, that level shifter 220 effectively shifts the logic high signal levels transmitted from logic block 216 up to the voltage existing at terminal ADRVR_$V_{GG}$. Since the voltage at terminal ADRVR_$V_{GG}$ is guaranteed to be at a higher magnitude than the top rail voltage magnitude of node 226, the $V_{GS}$ of P-type transistor 228 within inverter 222 is guaranteed to be equal to or greater than its threshold voltage, $V_t$. Thus, transistor 228 is rendered fully non-conductive under all phases of operation where a logic low level is desired on address line 224.

Figure 5:
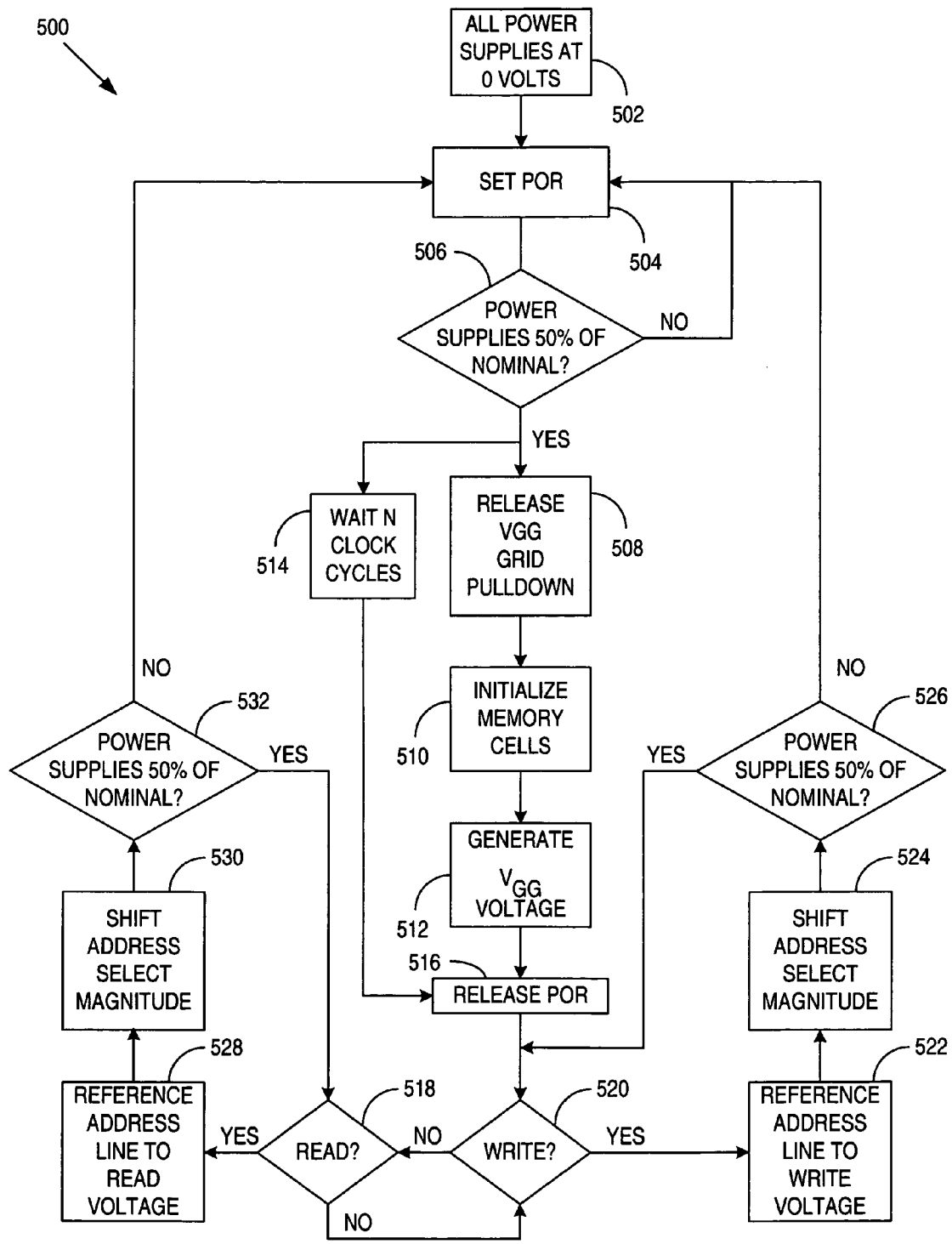
FIG. 5 illustrates an example flowchart of a method in accordance with the present invention.

Turning now to FIG. 5, flow diagram 500 is presented to illustrate an example method of controlling the address line voltage applied to a memory cell in accordance with an embodiment of the present invention. In state 502, all power supplies are in a power off condition, i.e., at 0 volt output potential, the POR signal is asserted as in step 504, and all power supplies are activated and allowed to achieve at least 50% of their nominal operational voltage magnitudes as in step 506.

Once all power supplies have reached their 50% operational voltage magnitude, a timer programmed with a predetermined amount of time, e.g., N clock cycles, is started as in step 514, while steps 508–512 progress. In particular, the generated $V_{GG}$ grid is released from ground potential and is allowed to slowly rise in potential as in step 508. Each of the address line voltage generators 218 within the FPGA are expected to weakly drive their respective address lines up to a potential that is substantially equivalent to a transistor threshold voltage, $V_t$. In so doing, the generated $V_{GG}$ grid and the address lines each ramp up in voltage at substantially the same rate to initialize the memory cells as in step 510. In step 512, the generated $V_{GG}$ voltage is allowed to ramp up to its nominal operational level. Once the timer of step 514 has expired, signal POR is released as in step 516.

Once POR has completed, determination of the memory cell's action is made in steps 518 and 520. If the memory cell is to be written as in step 520, then the address of the memory cell is referenced to the appropriate write voltage, e.g., $V_{GG}$, as in step 522 and the address select logic is shifted up in magnitude to be equal to or greater than the magnitude of the address line write voltage as in step 524. The magnitude of the power supplies continues to be monitored, as denoted by step 526, and the POR state is re-entered if it is determined that the power supplies have fallen below 50% of their nominal operational values.

If, on the other hand, the memory cell is to be read as determined in step 518, then the address of the memory cell is referenced to the appropriate read voltage, e.g., $V_{DD}$, as in step 528 and the address select logic is shifted up in magnitude to be equal to or greater than the magnitude of the address line read voltage as in step 530. The magnitude of the power supplies continues to be monitored, as denoted by step 532, and the POR state is re-entered if it is determined that the power supplies have fallen below 50% of their nominal operational values.

Embodiments of the present invention are believed to be applicable in a variety of memory cell applications. In particular, although the address line driver circuits disclosed herein have been discussed in relation to IC applications using MOS processes, one of ordinary skill in the art will recognize relevant application to bipolar IC processes, and discrete applications as well. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of controlling a signal level of a memory cell address line, comprising:
   detecting an operational state of a memory cell;
   selecting one of a plurality of multiplexed signal levels onto the memory cell address line in response to the operational state;
   wherein selecting one of a plurality of multiplexed signal levels includes,
      generating a second write signal level from a first write signal level using an auxiliary power supply to increase a current sourcing capability of the first write signal level;
      increasing a magnitude of the first write signal level by a transistor threshold voltage;
      conducting a first current signal in response to the first write signal level;
      conducting a second current signal in ratio proportion to the first current signal; and
      generating the increased magnitude of the first write signal in response to the second current signal; and
   level shifting a first logic level of a memory cell address select line to be at least equal to the selected signal level.

2. The method according to claim 1, wherein generating the second write signal level further comprises:
   applying the increased magnitude of the first write signal to a control terminal of current control device;
   conducting a third current signal from the auxiliary power supply through the current control device in response to the application of the increased magnitude of the first write signal; and
   generating the second write signal level in response to the third current signal.

3. The method according to claim 2, further comprising selecting the second write signal level during a write state and selecting a read signal level during a read state.

4. The method according to claim 1, wherein selecting one of a plurality of multiplexed signal levels comprises applying ground potential to the memory cell address line during a first Power On Reset (POR) phase.

5. The method according to claim 4, wherein selecting one of a plurality of multiplexed signal levels further comprises releasing the memory cell address line from ground potential after a predetermined amount of time has elapsed.

6. A memory cell address line generator, comprising:
an analog driver adapted to generate a first signal having first and second amplitudes;
an address line generator coupled to the analog driver and adapted to provide the first signal to a memory cell address line during first and second modes of operation and adapted to apply a second signal having a plurality of amplitudes to the memory cell address line during a third mode of operation;
a level shifter coupled to the analog driver and adapted to increase a level of a received memory cell address select signal to be at least equal to the first and second amplitudes of the first signal;
wherein the analog driver includes,
a buffer coupled to receive a first voltage reference signal and adapted to generate a second voltage reference signal having a magnitude greater than a magnitude of the first voltage reference signal;
a write signal generator coupled to receive the second voltage reference signal and a first power supply signal and adapted to generate the first signal at the first amplitude, wherein the first amplitude is substantially equal to the first voltage reference signal; and
a multiplexer coupled to the write signal generator and adapted to select the first signal at the first amplitude during a write mode of operation and adapted to select a second power supply signal as the first signal at the second amplitude during a read operation.

7. The memory cell address line generator according to claim 6, wherein the buffer comprises a current mirror, the current mirror comprising:
a first transistor coupled to receive the first voltage reference signal and adapted to conduct a first current signal in response to the first voltage reference signal; and
a second transistor coupled to the first transistor and adapted to conduct a second current signal in ratio proportion to the first current signal, wherein the second voltage reference signal is generated in response to the second current signal.

8. The memory cell address line generator according to claim 7, wherein the write signal generator comprises a third transistor coupled to receive the second voltage reference signal and adapted to conduct a third current signal from the first power supply signal in response to the second voltage reference signal, the third transistor generating the first signal at the first amplitude.

9. The memory cell address line generator according to claim 6, wherein the address line generator comprises a first pull-down transistor coupled to the memory cell address line and adapted to select an amplitude of the second signal substantially equal to ground potential in response to detecting a magnitude of the second power supply signal being greater than a magnitude of the first power supply signal.

10. The memory cell address line generator according to claim 9, wherein the address line generator further comprises a second pull-down transistor coupled to the memory cell address line and adapted to select an amplitude of the second signal substantially equal to ground potential for a predetermined amount of time.

11. The memory cell address line generator according to claim 10, wherein the address line generator further comprises a pull-up transistor coupled to the memory cell address line and adapted to select an amplitude of the second signal substantially equal to the first signal at the first amplitude upon expiration of the predetermined amount of time.

12. In a Field Programmable Gate Array (FPGA), a system of addressing a memory cell comprises:
means for applying a plurality of voltage signal levels to an address line of a memory cell during a power up sequence;
means for applying a read voltage signal level to the address line during a read sequence;
means for applying a write voltage signal level to the address line during a write sequence; and
means for shifting an amplitude of an address select signal associated with the memory cell to be at least equal to the read and write voltage signal levels during the respective read and write sequences.

13. The system according to claim 12, wherein means for applying a plurality of voltage signal levels to an address line comprises:
means for detecting a difference between a first power supply signal and a second power supply signal; and
means for applying a voltage signal level substantially equal to zero in response to a magnitude of the second power supply signal exceeding a magnitude of the first power supply signal.

14. The system according to claim 13, wherein means for applying a plurality of voltage signal levels to an address line further comprises means for applying a voltage signal level substantially equal to zero for a predetermined amount of time.

15. The system according to claim 14, wherein means for applying a plurality of voltage signal levels to an address line further comprises means for applying the write voltage signal level to the address line in response to the expiration of the predetermined amount of time.

16. The system according to claim 12, wherein means for shifting a logic high amplitude of an address select signal comprises:
a level shifting device, the level shifting device obtaining operational power from a first power supply signal; and
an inverting device, the inverting device obtaining operational power from a second power supply signal.

17. The system according to claim 16, wherein an amplitude of the first power supply signal is at least equal to an amplitude of the second power supply signal.

* * * * *